(12) United States Patent
Mitrovic et al.

(10) Patent No.: US 7,789,963 B2
(45) Date of Patent: Sep. 7, 2010

(54) CHUCK PEDESTAL SHIELD

(75) Inventors: Andrej S. Mitrovic, Phoenix, AZ (US);
Steven T. Fink, Mesa, AZ (US)

(73) Assignee: Tokyo Electron Limited, Tokyo (JP)

( * ) Notice: Subject to any disclaimer, the term of this patent is extended or adjusted under 35 U.S.C. 154(b) by 754 days.

(21) Appl. No.: 11/065,065

(22) Filed: Feb. 25, 2005

(65) Prior Publication Data

US 2006/0191484 A1    Aug. 31, 2006

(51) Int. Cl.
*C23C 16/00* (2006.01)
*C23F 1/00* (2006.01)
*H01L 21/306* (2006.01)

(52) U.S. Cl. .................. 118/729; 118/719; 156/345.54

(58) Field of Classification Search ................ 118/729; 156/345.54
See application file for complete search history.

(56) References Cited

U.S. PATENT DOCUMENTS

| | | | |
|---|---|---|---|
| 5,772,770 A * | 6/1998 | Suda et al. .................. 118/719 |
| 6,435,798 B1 * | 8/2002 | Satoh ......................... 414/217 |
| 6,508,199 B1 * | 1/2003 | Oyabu ..................... 118/723 E |
| 2003/0029564 A1 | 2/2003 | Brown et al. |
| 2003/0029568 A1 * | 2/2003 | Brown et al. ........... 156/345.51 |
| 2004/0060513 A1 * | 4/2004 | Kojima et al. ............... 118/715 |
| 2004/0089239 A1 * | 5/2004 | Shang et al. ................ 118/729 |

* cited by examiner

*Primary Examiner*—Michael Cleveland
*Assistant Examiner*—Nathan K Ford
(74) *Attorney, Agent, or Firm*—Oblon, Spivak, McClelland, Maier & Neustadt, L.L.P.

(57) ABSTRACT

An apparatus for processing semiconductors includes a processing chamber including a plurality of chamber walls, a substrate holder, positioned within the processing chamber and configured to support the substrate, and a linear displacement device, coupled between a base wall of the plurality of walls and the substrate holder and configured to move the substrate holder relative to the base wall. A shielding part extending from the substrate holder to be in close parallel relation with at least one of the plurality of walls such that a first area of the processing chamber is substantially shielded from a processing environment to which the substrate is exposed.

22 Claims, 8 Drawing Sheets

CHUCK PEDESTAL SHIELD

BACKGROUND OF THE INVENTION

1. Field of the Invention

The present invention relates to the field of semiconductor manufacturing equipment, more particularly the plasma reactor chambers for vacuum conditions for processing substrate material.

2. Discussion of the Background

The fabrication of integrated circuits in the semiconductor industry typically employs plasma to create and assist surface chemistry within a plasma reactor. Such plasma reactor is required to remove material from and deposit material to a semiconductor substrate. In general, plasma is formed with the plasma reactor under vacuum conditions in a vacuum chamber by heating electrons to energies sufficient to sustain ionizing collisions with a supplied process gas. Gas is introduced via a gas inject plate into the plasma processing chamber. The gas is subsequently heated by a strong electrical field between an upper electrode assembly and a substrate. Moreover, the heated electrons can have energy sufficient to sustain dissociative collisions. Therefore, a specific set of gases under predetermined conditions (such conditions are for example the chamber pressure, gas flow rate etc.) are chosen to produce a population of charged species and chemically reactive species suitable to the particular process being performed within the chamber. Such processes can be for example the etching processes where materials are removed from the substrate or deposition processes where materials are added to the substrate.

The plasma can be formed by a capacitively coupled plasma (CCP) source, an inductively coupled plasma (ICP) source, an electrostatic radio frequency (ESRF) source, or any combination thereof, and with or without DC magnet system. Alternately, the plasma can be formed using electron cyclotron resonance (ECR), by launching a Helicon wave or by a propagating surface wave.

The semiconductor manufacturing industry is a very competitive marketplace. Constant efforts are done to reduce the cost associated with semiconductor processing by reducing the size of the apparatus, number of parts in the chamber, and the required maintenance of the chamber. Since a vacuum chamber is expensive and it is desirable that only a small area needs to be vacuumized, ideally only the area between the substrate and the upper electrode assembly, a different design of the processing chamber might be more suitable for such processes.

In plasma processing chambers used throughout the semiconductor industry, the chuck assembly for holding the substrate inside the plasma processing chamber in a firm and precise position can typically be moved in vertical direction by a linear displacement device in order to change the distance between the substrate and the upper electrode assembly. The variation of the distance of the substrate to the upper electrode assembly is desirable to have the possibility to vary the plasma properties of the heated electrons bombarding the substrate in etching and deposition processes. The electrical field between the substrate and the upper electrode assembly is varied with the distance. In other words, the closer the substrate is to the electrode, the higher the electron temperature is. Additionally, the gas flow dynamics can be varied by changing this distance. Basically, the gas flow in the plasma processing chamber is directed from the gas inject plate of the upper electrode assembly to the pumping port of the processing chamber. The stream lines of the gas might be varied, depending on the cross-section area between the side walls and the chuck assembly as well as the distance between the substrate and the upper electrode assembly. Thus, a movable chuck configuration can be used to vary process conditions in the chamber. However, these configurations have several drawbacks including the following.

First, movable chuck configurations can be more prone to particle contamination within the chamber. Specifically, since the linear displacement device should not be in a vacuumized area, the device is hermetically enclosed and protected by a bellows. The bellows surrounds the linear movement device and is fixed to a lower portion of the chuck assembly and the processing chamber base wall, enclosing the linear displacement device entirely.

While the substrate being processed has a controlled temperature, the lower portions of the processing chamber might have a lower temperature close to the room temperature, still allowing the chemicals to react and to deposit contaminants on the chamber walls, and on the bellows itself. While the bellows is typically shielded from the substrate processing environment, existing shields do not adequately prevent contaminants from depositing on the bellows. If contaminants are deposited onto the bellows, such particles might flake off as soon as the linear displacement device is moved. Such contaminants can exit the area inside the bellows shielding and may circulate with the gas flow inside the plasma processing chamber, seriously interfering with the deposition or etching process, and can damage the substrate. Furthermore, since the bellows is a moving part, accumulation of particles thereon would decrease the functionality of the bellows, which would have to been cleaned or replaced frequently.

Another drawback of the existing plasma processing chambers having a movable chuck is the grounding of the substrate. In order to create an electrical field between the substrate and the upper electrode assembly, a return path for RF current has to be provided. Current chucks usually have a ground path through a metal bellows. However, such a ground path is not optimal, since it may have excessive reactive impedance, and is inductively long. A ground path may also be provided through the bellows shielding. A result of this might be an unequal distribution of RF potential on the chuck and therefore an inconsistent plasma could result, which is very unfavorable for any etching or deposition process

SUMMARY OF THE INVENTION

An object of the present invention is to address the above described and/or other problems with conventional processing chambers.

Another object of the present invention is to improve the grounding of the substrate on the chuck assembly to improve consistency of plasma conditions above the substrate.

Yet another object of the invention is to decrease costs associated with a plasma processing chamber by reducing a total size or volume of processing chamber and/or using a smaller number parts.

Still another object of the present invention is the improvement of the excessive parasitic particle generation seen in current plasma processing equipment.

These and/or other objects of the invention may be provided by a substrate processing apparatus in accordance with the present invention. According to one aspect, the apparatus for processing semiconductors includes a processing chamber including a plurality of chamber walls, a substrate holder, positioned within the processing chamber and configured to support the substrate, and a linear displacement device, coupled between a base wall of the plurality of walls and the substrate holder and configured to move the substrate holder relative to the base wall. A shielding part extending from the substrate holder to be in close parallel relation with at least one of the plurality of walls such that a first area of the processing chamber is substantially shielded from a processing environment to which the substrate is exposed.

According to another aspect of the invention, the apparatus for processing semiconductors includes a processing chamber including a plurality of chamber walls, a substrate holder, positioned within the processing chamber and configured to support the substrate, and a linear displacement means mounted to a base wall of the plurality of chamber walls, for moving the substrate holder. A means for utilizing one of the plurality of chamber walls to substantially shield a first area of the processing chamber from a processing environment to which the substrate is exposed.

BRIEF DESCRIPTION OF THE DRAWINGS

Other characteristics and advantages of the invention will become apparent from the following detailed description, particularly when considered in conjunction with the drawings in which.

DESCRIPTION OF THE PREFERRED EMBODIMENTS

Figure 1:
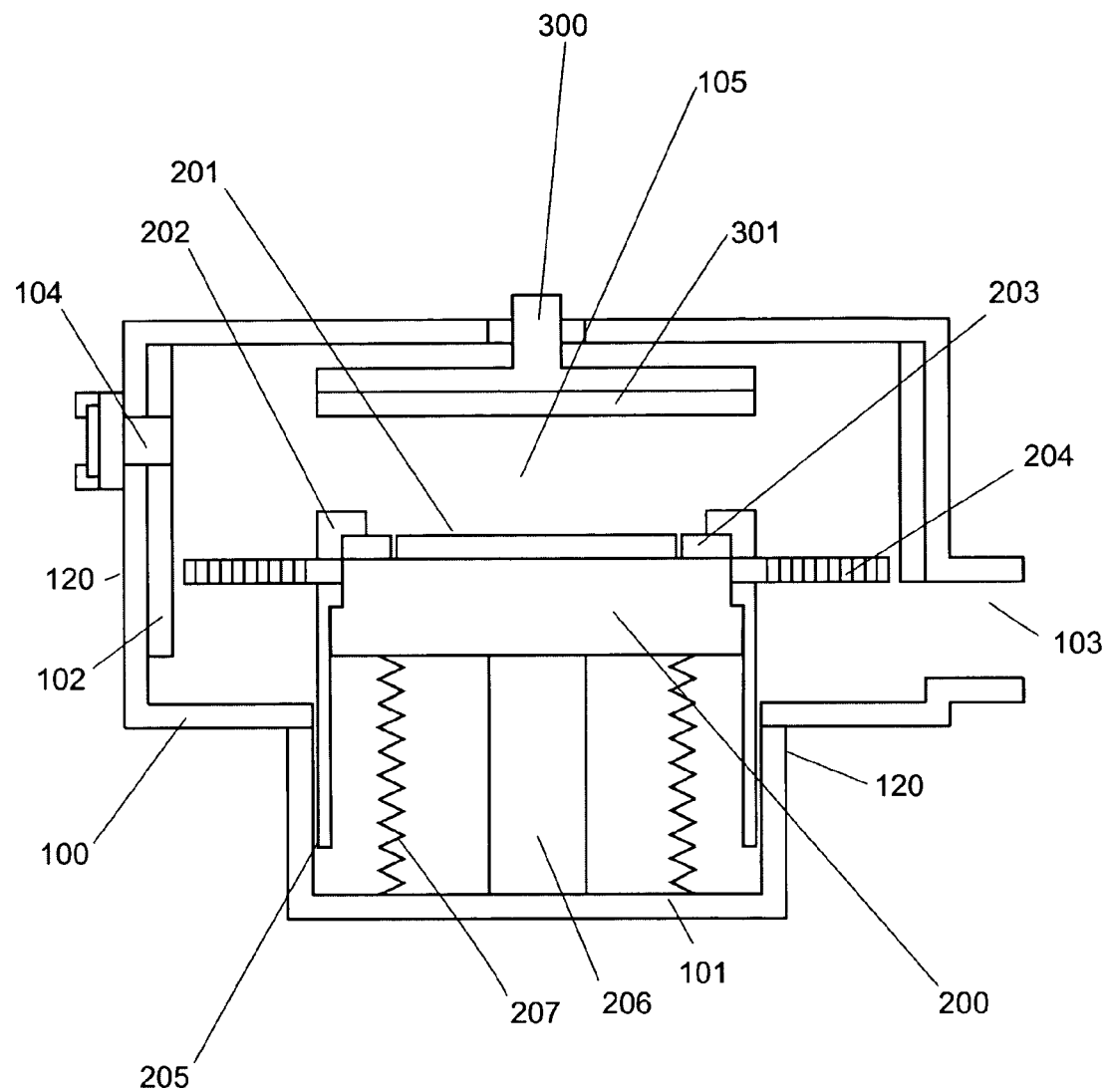
FIG. 1 illustrates a cross-sectional view of a plasma processing chamber using the processing chamber wall as a bellows shield; according to one embodiment of the present invention.

Referring now to the drawings, wherein like reference numerals designate identical or corresponding parts throughout the several views.

To facilitate an understanding of the present invention, the background processing chamber of FIG. 6 will first be discussed. As seen in this figure a processing chamber 100 includes a plurality of processing chamber walls (such as walls 101 and 120) enclosing a chuck assembly 200 and upper electrode assembly 300. Gas inside the chamber is evacuated through a pumping port 103 arranged in a side wall of the processing chamber and a chamber window 104 is arranged in a side wall to allow observation of the processes from outside of the plasma processing chamber. The upper electrode assembly 300 includes a gas inject plate 301, where gas can be injected to the process plasma volume 105. The process plasma volume is the area located between the upper electrode assembly 300 and substrate 201 mounted onto an upper portion of the chuck assembly 200. In a plasma process, while gas is injected to the process plasma volume, the gas subsequently reacts in the electrical field generated between the upper electrode assembly and the substrate to create plasma. The plasma contains electrons for reaction processes such as etching or deposition onto the substrate 201.

The chuck assembly 200 functions as a substrate holder for the etching and deposition processes, for example. The chuck assembly includes a shield ring 202, focus ring 203 and pumping baffle 204 attached thereto. The chuck assembly 200 can be moved up and down in the processing chamber 100 to increase or decrease a distance of the substrate 201 from the upper electrode assembly 300. The linear displacement device 206 is therefore used. The gases injected by the gas inject plate 301 are evacuated in a side portion next to the chuck assembly 200. The gas passes through pumping baffles 204, which are fixed to the chuck assembly and are extended to the side walls of the processing chamber. The linear displacement device 206 is mounted to move vertically and is placed in the middle of the processing chamber wall 101 in FIG. 6. The linear displacement device is enclosed in a bellows 207, which is arranged around the linear displacement device and substantially parallel with the axis of movement of the linear displacement device. The bellows 207 is usually welded to the processing chamber base wall 101 and to the chuck assembly 200 in order to provide a hermetical sealing between the non-vacuum area where the linear displacement device is located and the vacuum area plasma processing chamber. Since the bellow is made of conductive material, such as metal, welding of the bellows provides a ground path between the chuck assembly and the processing chamber base wall. This ground path allows return of the RF current.

Additionally, the bellows 207 is shielded with an inner shield 208 and outer shield 205 for protection. Usually, an outer bellows shield 205 is fixed to the movable chuck assembly, and an inner bellows shield 208 is fastened to the processing chamber base wall as shown in FIG. 6. The inner bellows shield 208 and the outer bellows shield 205 are mounted close to each other to protect the bellows 207 from parasitic deposition of by-products from the plasma process. When the chuck assembly 200 is moved linearly, the inner and outer bellows shield move in parallel and maintain a close spacing to protect the bellows 207 inside the shielding. Even if the linear movement device 206 extends to the largest possible extension range, when substrate is the closest possible to the upper electrode assembly, ideally, a portion of the inner and outer bellows shield will overlap each other. In this way, even if the chuck assembly 200, or substrate holder is very close to the upper electrode assembly, the bellows is still protected by the shielding.

Figure 6:
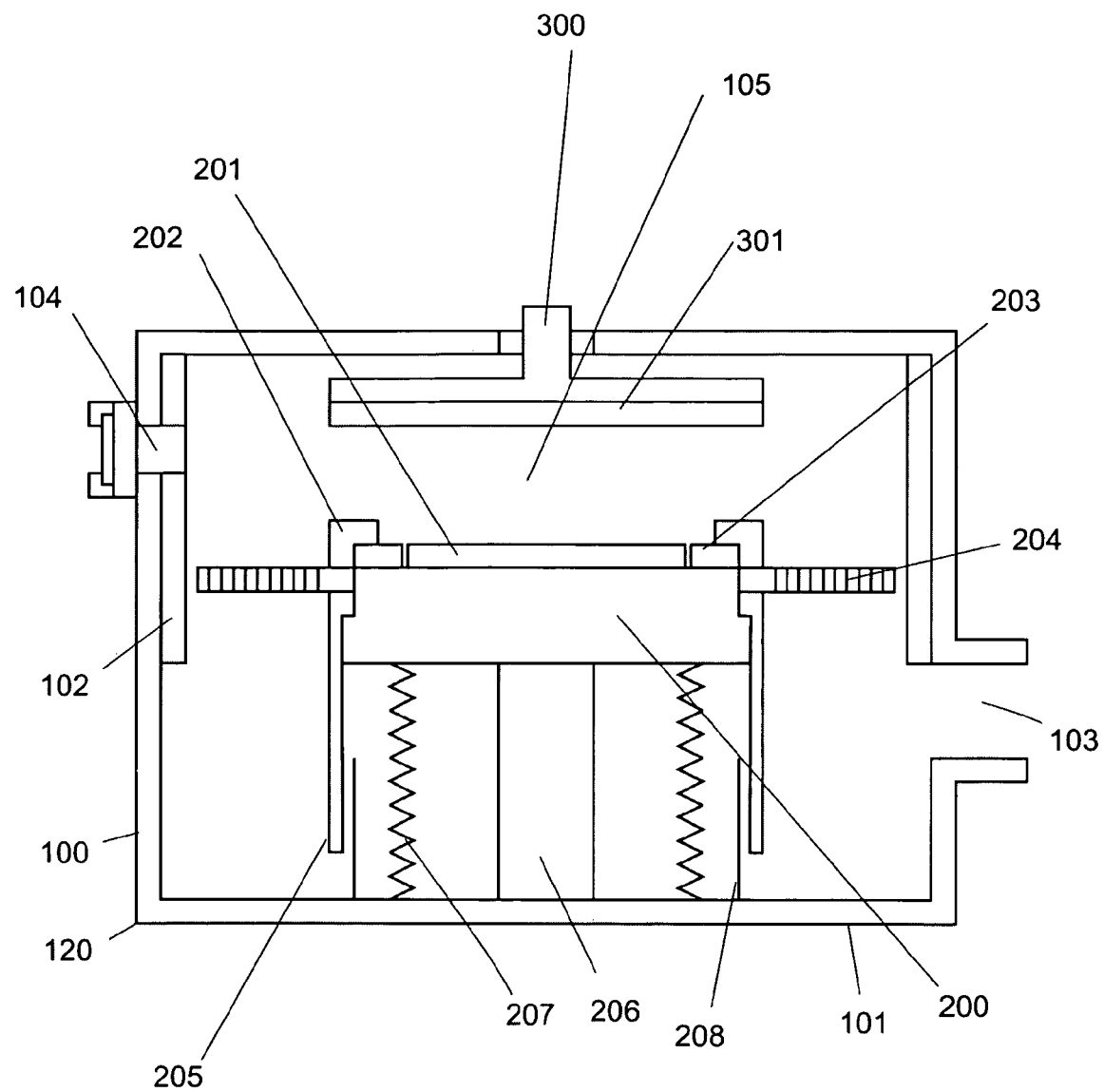
FIG. 6 illustrates a cross-sectional view of a background plasma processing chamber.

A first embodiment of the present invention can be seen in FIG. 1, which includes similar components as those described with respect to FIG. 6, and therefore a full description of all components is not provided for FIG. 1. As seen in FIG. 1, the processing chamber 100 includes a linear displacement device 206 for moving the substrate holder assembly 200, and a bellows 207 surrounding the linear placement device 206 as described above. The linear displacement device 206 may be a linear servo motor, linear stepper motors, pneumatic or hydraulic linear actuators, linear translation devices coupled to rotative motors, screw travel stages coupled to rotative motors, or any other movement mechanism known in the art. The bellows 207 can be of circular shape, but can also be rectangular, square-shaped, etc, as long as the linear displacement device is enclosed. The bellows 207 is usually made of metal and separates the linear displacement device 206 from the vacuum chamber processing environment. To achieve an increased gas-tightness to the vacuum, and to assist in electric conductivity between the substrate and the processing chamber walls, bellows 207 is usually welded to the chuck assembly and the processing chamber base wall, however other known sealing methods may be used. Moreover, in accordance with an embodiment the present invention, the bellows 207 does not need to provide a conductivity path to the chamber wall 120, as the RF current is coupled across the gap capacitively.

In the embodiment of FIG. 1, instead of having a bellows shield mounted to the processing chamber wall, a portion of the processing chamber wall 120 is shaped in a way that it forms a shield itself, arranged in parallel with the moveable inner bellows shield 205. The inner bellows shield 205 is formed on the movable chuck assembly, staging device or substrate holder assembly 200, extended downwards, substantially in parallel to the moving axis of the linear displacement device 206. The processing chamber wall 120 is thus modified to incorporate the shielding of the bellows 207.

The processing chamber 100 of FIG. 1 is formed of two different sections, one section with the upper electrode assembly 300, the process plasma volume 105 and the substrate 201 with the chuck assembly 200 having the full width of the processing chamber 100, and a lower section where the linear displacement device 206 is located, together with the protecting bellows 207 and the inner shielding 205. The upper section of the plasma processing chamber has chamber liners 102 installed to the side walls. The lower section of the processing chamber 100 is narrower, and the processing chamber walls 120 at the narrower section of the processing chamber 100 form a first bellows shield. For this reason, the processing chamber 100 does not have a rectangular cross-section shape as shown in the background processing chamber 100 of FIG. 1. By having a reduced diameter in the lower section, the processing chamber walls 120 can be very close to the bellows shield 205 mounted to the chuck assembly 200 thereby acting as an additional bellows shield.

A portion of the chamber side walls 120 and the bellows shield 205 are arranged in parallel next to each other, so that they can move linearly next to each other, thereby forming a small gas gap between the plasma processing chamber and the area inside the bellows shielding. In a first embodiment, when the chuck assembly 200 is moved up and down, the bellows shield 205 and the processing chamber side wall 120 will always overlap to protect the bellows 207, even when the linear displacement device 206 extends to the highest possible position. The outer bellows shield 205 is usually of circular shape, in order to enclose the bellows 207 and the linear displacement device 206. The bellows shield 205 and the side walls 120 can be any other shape, as long as both bellows shield 205 and side walls 120 fit together and as long as they enclose the bellows 207 and the linear displacement device 206. Such shapes can be ovals, rectangular shape, rectangular shape with rounded corners, square shape, etc.

The gas gap between the processing chamber wall 120 and the inner bellows shield 205 of FIG. 1 has a width sufficient to substantially shield the processing environment of the processing chamber 100 from of the bellows 207. As would be understood by one of ordinary skill in the art, the width of the gap necessary to provide sufficient shielding is dependant on the process and/or process parameters (such as pressure) performed in the processing chamber. In one embodiment, the width is between 0.1 mm and 3 mm, more preferentially between 0.3 mm and 0.66 mm, and even more preferably between 0.1 and 0.3 mm and the length of the gas gap between two bellows shields can vary between 5 mm and 200 mm.

Thus, as seen in FIG. 1, a substrate processing apparatus according to the present invention integrates a portion of the processing chamber wall as part of the bellows shield, thereby reducing the total number of system parts, which may reduce assembly and other costs. While FIG. 1 shows the side wall 120 forming part of the shield, other portions of the walls may be used as described below. In the embodiment of FIG. 1, because the diameter in the lower section of the plasma processing chamber is reduced, the overall volume of the processing chamber is reduced, which is advantageous since smaller vacuum equipment can be used for a same volume of a process plasma volume 105. Furthermore, the pumping speed in the chamber can be increased.

Figure 2A:
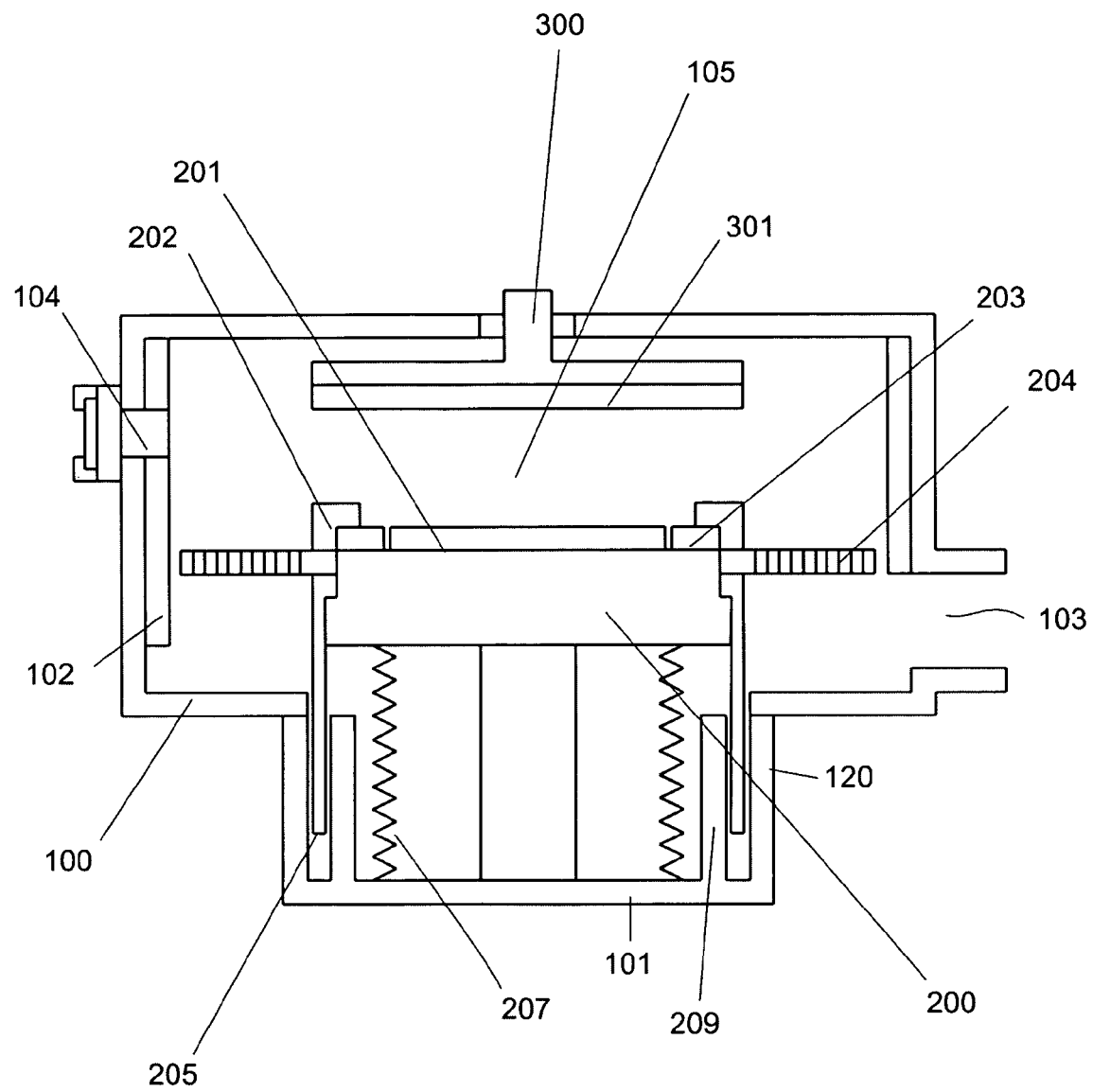
FIG. 2A-2B illustrates a cross-sectional view of a plasma processing chamber with grounding feature, according to another embodiment of the present invention.

In a second embodiment of the present invention shown in FIG. 2A, the plasma processing chamber 100 includes a protruding wall 209 that is integrated into the bellows shield. As seen in FIG. 2A, a protruding wall 209 extends from a base wall of the chamber 100 to function as an inner bellows shield. While the processing chamber wall 120 forms an additional bellows shield and provides a reduced diameter lower chamber portion in FIG. 2A, these features are not necessary to the second embodiment of the invention. That is, the protrusion 209 integral to the base wall may work with the shielding 205 alone, while the outer wall 120 is as shown in conventional FIG. 6. In FIG. 2A the processing chamber wall 120 in the lower section of the plasma chamber forms a first shielding for the bellows 207, an outer bellows shield 205 is mounted to the chuck assembly, extended vertically downwards towards the processing chamber base wall 101, in parallel with the processing chamber side wall 120 and between the processing chamber side wall 120 and the newly introduced inner bellows shield 209. This provides an additional shielding, extended vertically upwards towards the chuck assembly. This inner bellows shield 209 can either be fixedly mounted to the processing chamber base wall 101 or can be an integral part of the processing chamber base wall 101.

Due to its proximity to the vertically moveable outer bellows shield 205 and by overlapping the outer bellows shield 205, such an inner bellows shield 209 provides additional shielding to prevent deposition of contaminants onto the bellows 207. In other words, an gas path from the plasma processing chamber to the area inside the bellows shielding is significantly increased. In a cross-sectional view, the gas path from the vacuum processing chamber and the area between the shielding and the bellows 207 protecting the linear displacement device 206 forms a tortuous path. The use of such labyrinth shield assemblies results in the reduction of build up of contaminants generated during plasma processing on metal bellows assemblies and therefore a reduction of material to contaminate the process. Additionally, the costs associated with periodic chamber cleaning are reduced. When metal bellows are kept cleaner for longer periods and the contaminants flaking off the metal bellows are kept from the substrate, cleaning cycle times can be vastly improved and the machine down time is shortened. The gas gap spacing is small enough in width and long enough in length to reduce the passage of gases from plasma process area to the protected area. Such tortuous path reduces the gas flow between both chambers and prevents contaminants to access this area. As indicated above, the width of this gap and the length of the tortuous path varies with the parameters and/or type of process performed in the chamber.

Figure 2B:
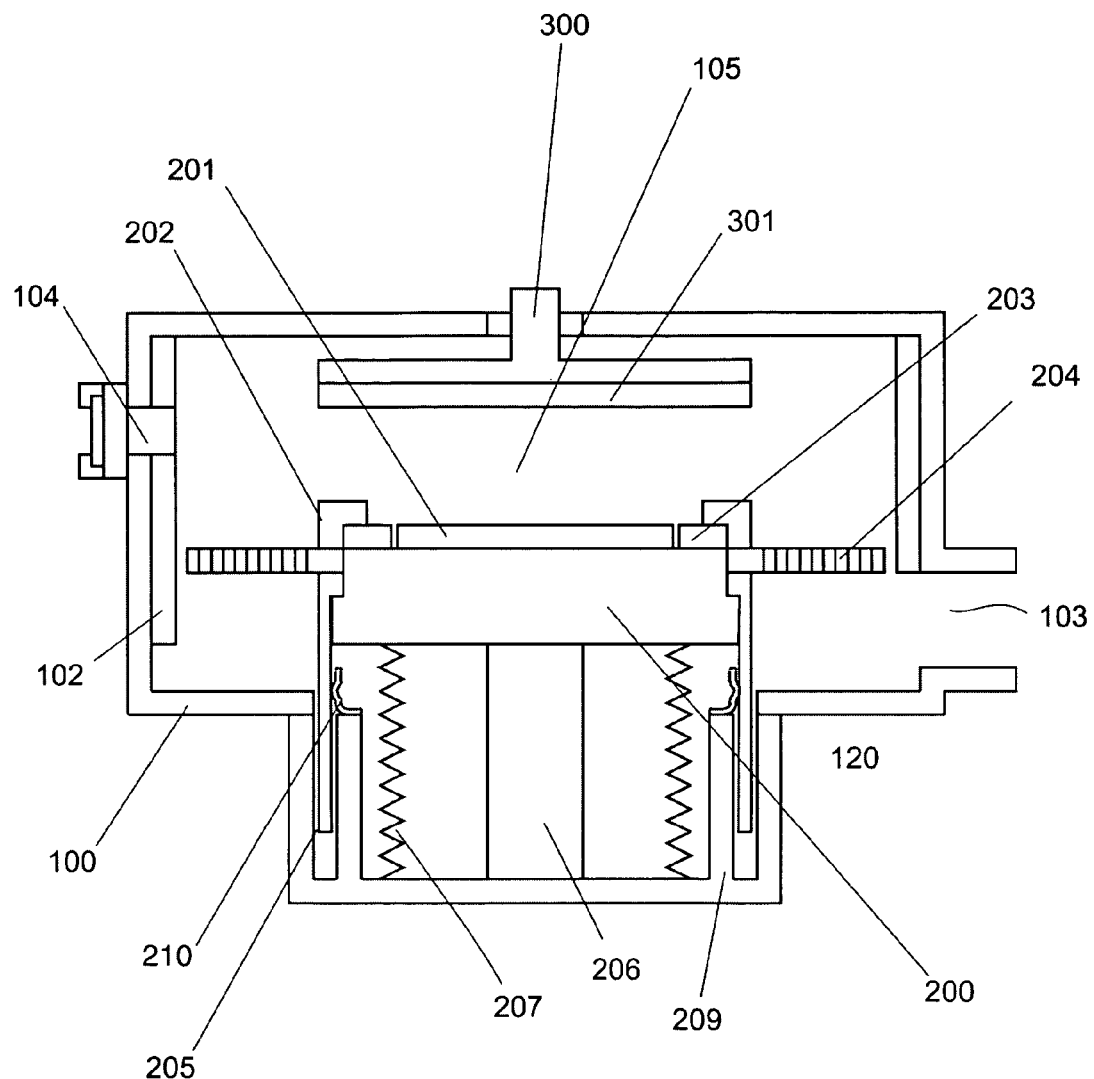

A third embodiment of the present invention is shown in FIG. 2B. In this embodiment, a ground path of the substrate is provided through the bellows shielding by an electrical connection with a grounding feature 210. The grounding feature 210 is mounted to a top portion of the inner bellows shield 209, hereby putting pressure onto the side wall of the outer bellows shield 205 assuring an electrical connection. The inner bellows shield 209, a part of the processing chamber base wall 101, is therefore electrically connected to the chuck assembly 200. An additional inner bellows shield is extended vertically upwards from the processing chamber base wall 101, close to the shield mounted to the chuck assembly 200. This ground path may be provided with or without an additional ground path through the bellows as described above. The grounding path improves the grounding of the substrate, which is mounted onto the chuck assembly 200.

The grounding feature 210 may be a gasket, a series of metallic leaf springs, a copper thread or a similar conducting part, and is preferably made of a highly-conductive material. Various types of metal fingerstock gaskets or Spira shield devices can be used. These gaskets usually combines high levels of EMI shielding effectiveness over a broad frequency range with springfinger wiping and low closure force properties, in order to achieve a good electrical connection to the outer bellows shield 205. Additional properties of the gasket material that are desired are high tensile strength, excellent anti-corrosion properties, and very high electrical conductivity between the outer and inner bellows shields. The gaskets are usually mounted to the inner bellows shield 209 can be soft soldered or resistance welded without damage to their working surface, or can be installed by edge mounting, slot mounting, using a track and plastic rivet system or by pressure-sensitive adhesive. In the embodiment of FIG. 2B, the grounding feature is mounted to the upper portion of the inner bellows shield and can be in contact with the inner wall of the outer bellows shield to provide an additional grounding path of the substrate. It is to be understood, however, that this feature can be applied to any bellows shield configuration disclosed herein. Moreover, the grounding features can be installed along the entire circumference of the inner bellows shield 209.

Figure 3A:
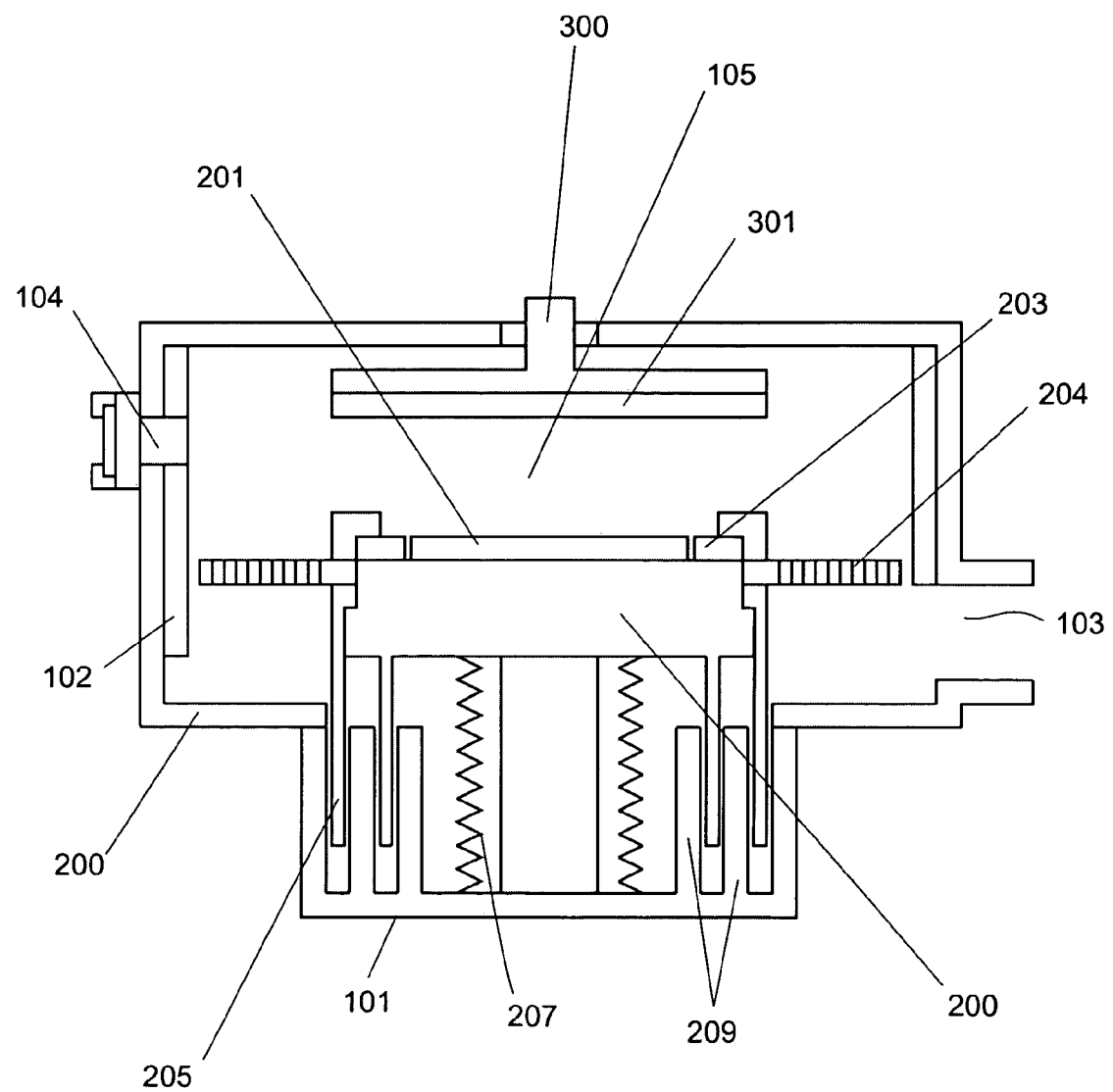
FIG. 3A-3B illustrates a cross sectional view of a plasma processing chamber with multiple bellows shielding and additional pumping port, according to another embodiment of the present invention.

Another embodiment of the present invention is shown in FIG. 3A, where a plurality of shield portions is shown. In this embodiment a second protruding wall is formed inside a first wall to form an additional inner bellows shield 209, and a second wall fixed to the chuck assembly 200 forming an additional outer bellows shield 205, moving between the two inner bellows shields 209. The first and second inner bellows shield can have the same cross-sectional dimensions, as well as the first and second outer bellows shield can have the same cross sectional dimensions. When the linear displacement device 206 moves the chuck assembly 200, the inner and outer bellows shields 209, 205 move in relation to each other, but the bellows shields maintain a substantially parallel position. The bellows shields are arranged in a way that even if the linear displacement device 206 extends the chuck assembly 200 to the highest possible position in the plasma processing chamber 100, the inner and outer bellows shields 209, 205 can always be overlapping each other. This configuration creates an even longer tortuous gas path between the plasma processing chamber and the area where the bellows 207 is located. Such additional inner wall can be mounted to the processing chamber base wall 101, or can be an integral part of the processing chamber base wall 101.

In the embodiment shown in FIG. 3A, there are two outer bellows shields 205 mounted to the chuck assembly and vertically moveable into two inner bellows shields 209. The bellows shield with the biggest diameter forms additionally the outer wall of the plasma processing chamber 100. As would be understood by one of ordinary skill in the art, not only a double-walled bellows shield can be used, but any number of outer and inner bellows shields 209, 205 are also within the scope of invention, to further increase a gas gap length from the plasma processing chamber to the area inside the bellows shields. Usually, the inner as well as the outer bellows shields are circular-shape walls, arranged concentrically around the bellows and the linear displacement device. However, the bellows shields can be of any different shape, as long as they enclose the bellows and as long as the inner and outer shields have substantially the same shape geometric outline, so as to fit into each other and to form a gas gap. If the walls for the shielding are circular or oval, every circular wall has a different diameter so as to be able to fit between two inner respectively two outer bellows shields.

Figure 3B:
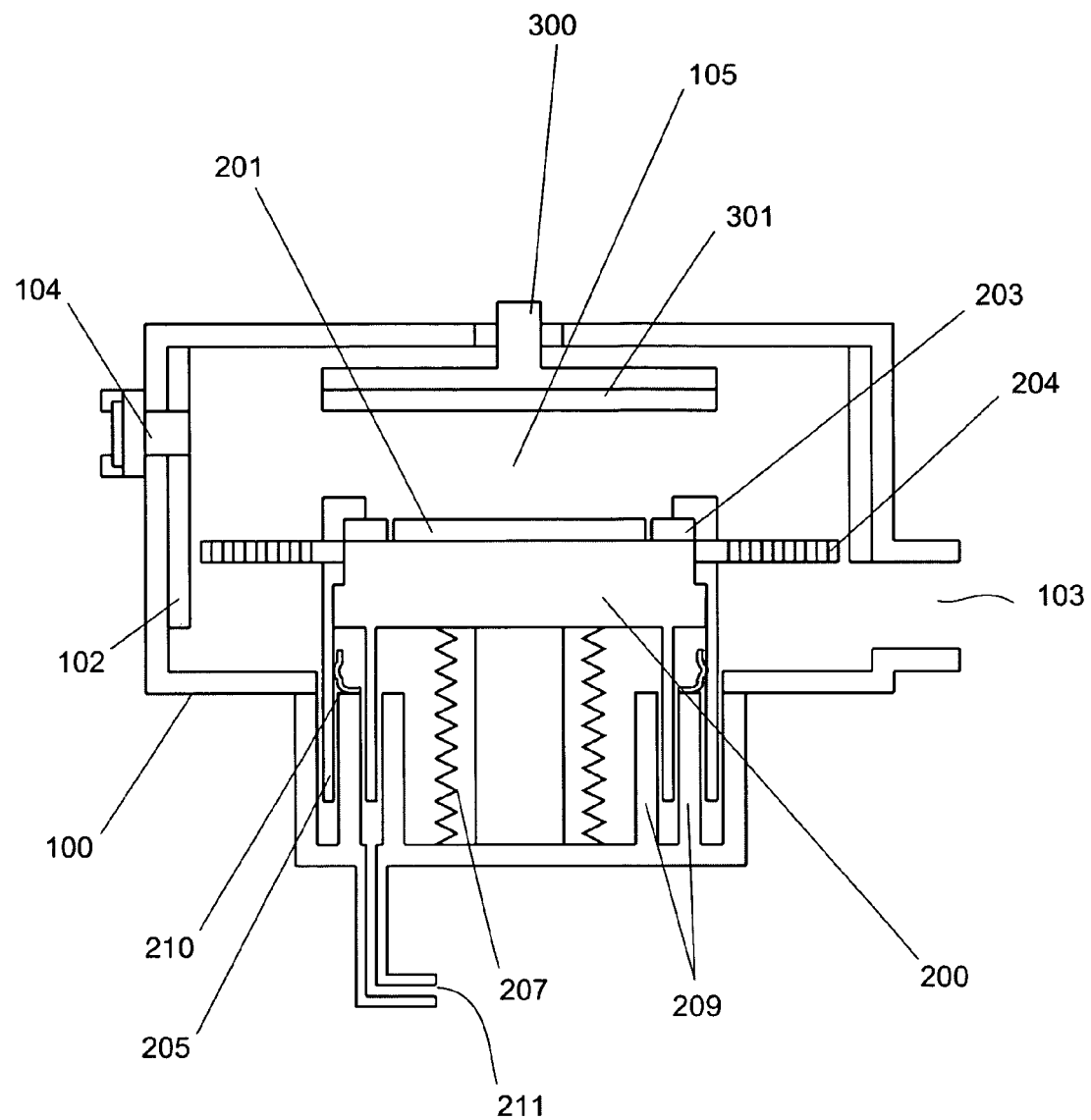

Still another embodiment of the present invention is shown in FIG. 3B, showing a similar plasma processing chamber as seen in FIG. 3A, but with additional features disclosed by this invention. In this embodiment, a pumping port 211 is installed to evacuate gas from the inner tortuous path of the bellows shielding 205 and 209. In the FIG. 3B the pumping port is located between the first and second wall of the inner bellows shield 209. Such a pumping port allows building up a differential pressure to further separate the processing chamber 100 from the area adjacent to the metal bellows 207. Gases that might create parasitic reactions in the area where the bellows is located and in the area of the tortuous path of the bellows shielding can be efficiently evacuated. While the pumping port 211 is shown with respect to FIG. 3B, it is to be understood that the pumping port may also be used with other configurations such as that shown in FIG. 2B, for example. Moreover, it is also possible that multiple pumping ports 211 are installed to improve evacuation. Such pumping ports can be located at multiple points around a circumference of an area between an inner and outer bellows shield, but can also be located in any or all the areas formed by a pair of inner and outer bellows shield 205 and 209. Such pumping ports improve further the plasma processing chamber 100 by increasing the protection provided by the bellows shielding.

Additionally a grounding feature such as a gasket can be seen in this embodiment. The grounding feature can be mounted on an upper portion of an inner bellows shield 209, connecting electrically to the chuck assembly 200. The use of labyrinth shield assemblies with additional labyrinth pumping ports again results in the reduction of build up of contaminants generated during plasma processing on metal bellows assemblies and therefore a reduction of material to contaminate the process. Additionally, the costs associated with periodic chamber cleaning are reduced. When metal bellows are kept cleaner for longer periods and the contaminants flaking off the metal bellows are kept from the substrate, cleaning cycle times can be vastly improved and the machine down time is shortened.

Figure 4:
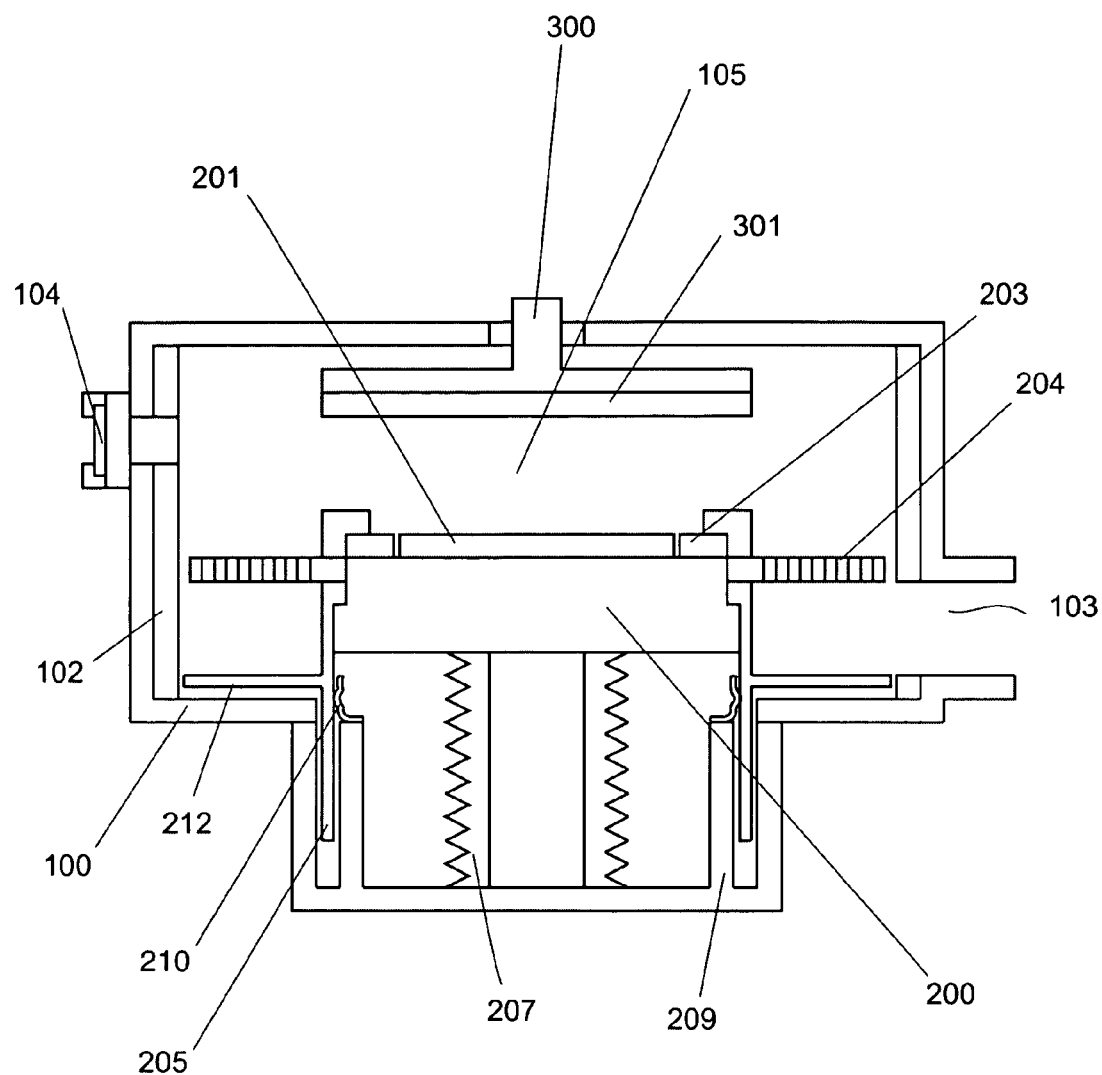
FIG. 4 illustrates a cross-sectional view of a plasma processing chamber with grounding feature and additional bellows shielding with chamber liners, according to another embodiment of the present invention.

Yet another embodiment of the present invention is shown in FIG. 4. In this embodiment a bellows shield is fixed to the chuck assembly and forms a bottom chamber liner 212. The bottom chamber liner 212 can be mounted to the external wall of the outer bellows shield 205, extended horizontally towards the chamber liner 102 installed inside the processing chamber wall. If the linear displacement device 206 is at is smallest vertical extension, the chamber liner is located close to the processing chamber bottom wall. The cross-sectional view of FIG. 4 shows that the tortuous gas path between the plasma processing chamber 100 and the area between the bellows shield and the bellows is increased, improving a protection of the bellows from deposition of by-products. Any gas circulation in the processing chamber is strongly limited to the upper section of the plasma processing chamber 100. Only a narrow gas gap is between the bottom chamber liner 212 fixed to the outer bellows shield 205 and the chamber liner 102. While FIG. 4 shows the bottom chamber liner 212 used in conjunction with the bellows shield 205, this is not necessary to the present invention. For example, the bottom chamber liner 212 may be used to provide a shielding of the bellows area in a predetermined position of the substrate holder without the use of the bellows shield provided by inner bellows shield 209 and outer bellows shield 205 shown in the embodiment of FIG. 4. Moreover, the bottom chamber liner may be mounted at the lower end of the shield 205 to work in conjunction with the base wall to provide shielding in a conventional chamber having a same size upper and lower portion.

Figure 5:
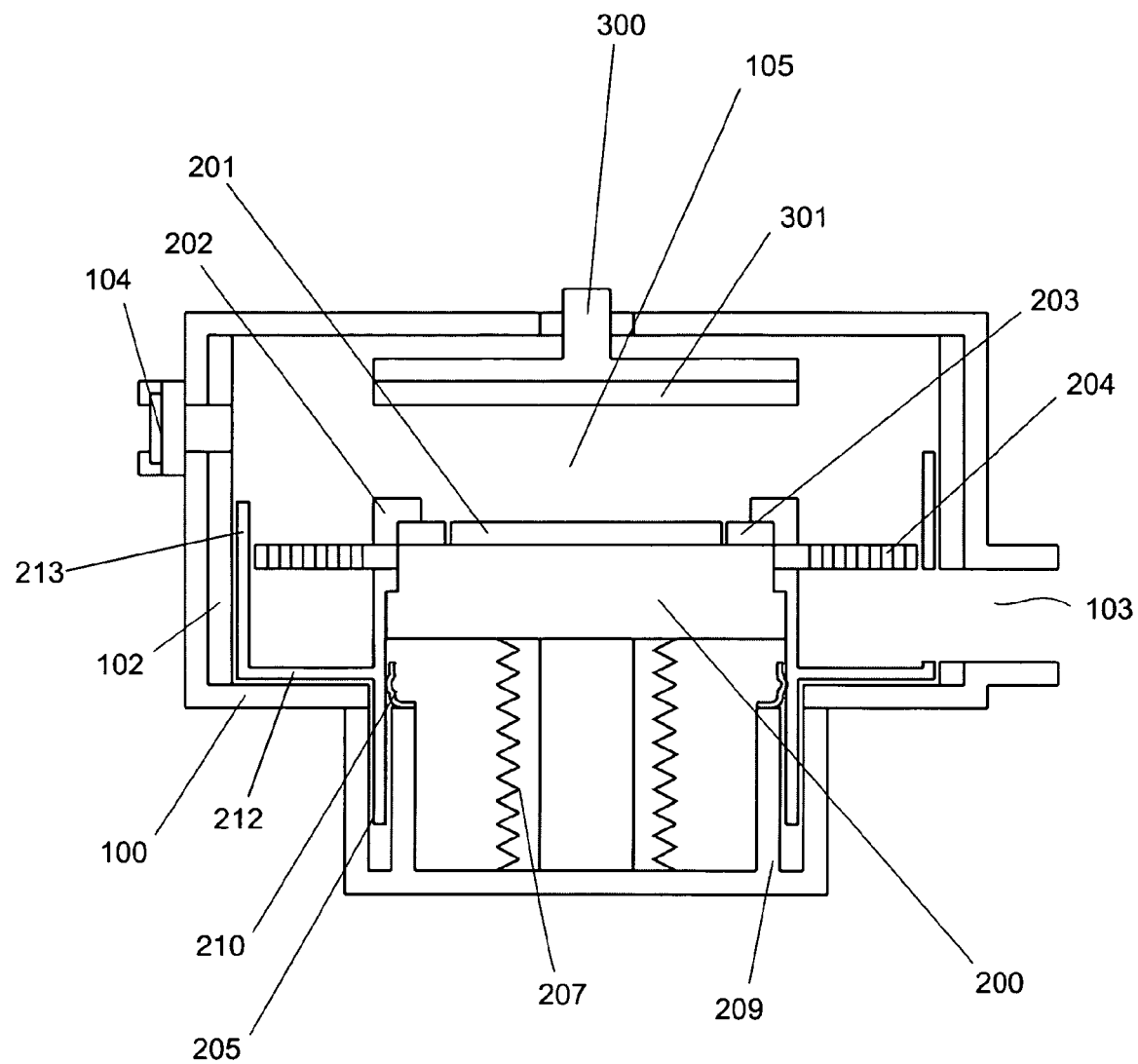
FIG. 5 illustrates a cross-sectional view of a plasma processing chamber with grounding feature and another bellows shielding with chamber liners, according to another embodiment of the present invention.

Still another embodiment of the present invention is shown in FIG. 5. In order to further increase the length of the gas path from the processing chamber 100 to the area between the bellows shielding and the bellows, the outer bellows shield 205 attached to the chuck assembly 200 forms a bottom chamber liner and a side wall chamber liner. The bottom chamber liner 212 extends horizontally to the chamber liner 102 fixed to the processing chamber wall and then extends vertically upwards forming a side wall chamber liner 213. The side wall chamber liner 213 is extended upwards over the pumping baffle 204 in parallel with the chamber liner 102, protecting the side walls of the processing chamber from deposition. Any gas circulation in the processing chamber is strongly limited to the upper section of the plasma processing chamber 100. The gas flow is directed with the gas baffles 204 towards the pumping port or in the area in the plasma processing chamber underneath the gas baffles 204, and therefore also underneath the gas gap provided by the vertical chamber liners 213. Therefore, the gas flow through the tortuous path to access the lower part of the plasma processing chamber is strongly limited. Again, while FIG. 5 shows the chamber liner 213 used in conjunction with the bellows shield 205 and 209, this is not necessary to the present invention.

In the embodiments of the present invention shown in FIGS. 4 and 5, the combination shield/chamber liner can be made of a metallic material. The metallic material can be aluminum or stainless steel. The metallic material may be partially or completely coated or uncoated. If metallic material is coated, the coating may be an anodic layer. The coating may be plasma resistant coating made from at least one of a III-column element (at least one of Yttrium, Scandium, and Lanthanum) and a Lanthanon element (at least on e of Cerium, Dysprosium and Europium). The plasma resistant coating may be made from at least one of $Y_2SO_3$, $Sc_2O_3$, $Sc_2F_3$, $YF_3$, $La_2O_3$, $CeO_2$, $Eu_2O_3$, and $DyO_3$. Additionally, the combination shield chamber liner including the bottom chamber liner 212 and a side wall chamber liner 213 may be constructed of a dielectric material or materials, or constructed of a partially dielectric and partially metallic structure, partially or fully coated or not, The dielectric material can be made from at least one of ceramic, quartz, silicon, silicon nitride, sapphire, polyimide, and silicon carbide.

In the embodiments of the present invention shown in FIG. 1 to FIG. 4A-B, the components used for the bellows shielding can be partially or completely coated or uncoated. It is also possible that the grounding elements being in connection with each other are uncoated, to provide an electrical ground path.

Obviously, numerous modifications and variations of the present invention are possible in light of the above teachings. It is therefore to be understood that, within the scope of the appended claims, the invention can be practiced otherwise than as specifically described herein.

What is claimed as new and desired to be secured by Letters Patent of the United States is:

1. An apparatus for processing a substrate, comprising:
   a processing chamber including a plurality of chamber walls that enclose a processing environment;
   a substrate holder, positioned within said processing chamber and configured to support the substrate;
   a linear displacement device, coupled between a base wall of said plurality of chamber walls and said substrate holder and configured to move said substrate holder relative to said base wall; and
   a bellows shield comprising a shielding part extending from said substrate holder toward said base wall and a chamber sidewall which is one of said plurality of chamber walls, said shielding part and said chamber sidewall functioning as inner and outer shields of the bellows shield, respectively, and being in sufficiently close parallel relation with a small gap therebetween to shield a first area of said processing chamber from the processing environment to which the substrate is exposed.

2. An apparatus for processing a substrate according to claim 1, wherein said substrate holder comprises a chuck assembly.

3. An apparatus for processing a substrate according to claim 1, wherein said linear displacement device is located in said first area.

4. An apparatus for processing a substrate according to claim 3, further comprising a bellows connected between said base wall and said substrate holder.

5. An apparatus for processing a substrate according to claim 4, wherein said bellows encloses the linear displacement device into a gas-tight area.

6. An apparatus for processing a substrate according to claim 1, wherein the linear displacement device includes at least one of the devices selected from worm gear, linear servo motor, linear stepper motors, pneumatic or hydraulic linear actuators, linear translation devices coupled to rotative motors, screw travel stages coupled to rotative motors.

7. An apparatus for processing a substrate according to claim 1, wherein
   said base wall comprises a protruding wall extending from the base wall towards the substrate holder,
   said shielding part extending from said substrate holder towards said base wall is substantially parallel to said protruding wall with a small gap therebetween, and
   said protruding wall and said shielding part function as inner and outer shields, respectively, to perform additional shielding of the first area from the processing environment.

8. An apparatus for processing a substrate according to claim 7, wherein said protruding wall also extends substantially parallel to the sidewall with another small gap therebetween and said shielding part interposed between said protruding wall and the sidewall.

9. An apparatus for processing a substrate according to claim 8, further comprising:
   a pumping port in said base wall in an area between the protruding wall and the sidewall to pump a gas from the area in order to provide a pressure difference between the area and the processing environment of the chamber.

10. An apparatus for processing a substrate according to claim 7, further comprising a grounding feature electrically connecting the protruding wall and said shielding part.

11. An apparatus for processing a substrate according to claim 7, wherein the base wall includes a plurality of said protruding walls concentrically spaced and extending from said base wall towards said substrate holder and said shielding part extends from the substrate holder towards said base wall and substantially parallel to each of said protruding walls with a respective small gap therebetween.

12. An apparatus for processing a substrate according to claim 11 further comprising:

a plurality of said shielding parts, said plurality of shielding parts extending from the substrate holder towards said base wall and arranged substantially in parallel to said plurality of protruding walls with a respective plurality of small gaps therebetween.

13. An apparatus for processing substrate according to claim 11, wherein said shielding part and said plurality of protruding walls maintain a parallel position during a movement of the substrate holder.

14. An apparatus for processing a substrate according to claim 11, wherein said shielding part includes another part which extends towards a side chamber wall such that it is substantially parallel to a wall that is substantially orthogonal to said side wall with a small gap therebetween.

15. An apparatus for processing a substrate according to claim 14, wherein said shielding part further comprises an additional part which extends vertically upwards over a top level of said substrate holder at an outer portion of said additional part extended towards said side wall.

16. An apparatus for processing a substrate according to claim 1, wherein said shielding part separates the processing chamber in an upper and lower processing chamber, and said lower processing chamber is smaller than the upper processing chamber.

17. An apparatus for processing a substrate according to claim 1, wherein said shielding part is electrically connected to the one of said plurality of chamber walls.

18. An apparatus for processing a substrate according to claim 1, wherein said small gap is between 0.1 mm and 3 mm.

19. An apparatus for processing semiconductors, comprising:
  a processing chamber including a plurality of chamber walls that enclose a processing environment;
  a substrate holder, positioned within said processing chamber and configured to support said substrate;
  a linear displacement means mounted to a base wall of the plurality of chamber walls, for moving the substrate holder; and
  means for utilizing a chamber sidewall of one of said plurality of chamber walls to form an outer shield of a bellows shield to substantially shield a first area of the processing chamber from a processing environment to which said substrate is exposed, said means including said chamber sidewall in sufficiently close parallel relation with a shielding part extending from said substrate holder toward said base wall and forming the inner shield of the bellows shield.

20. An apparatus for processing semiconductors according to claim 19, wherein said linear displacement means is located in said first area.

21. An apparatus for processing semiconductors according to claim 20, further comprising a bellows connected between said base wall and said substrate holder.

22. An apparatus for processing semiconductors according to claim 19, wherein the bellows shield is displaced by the linear displacement means.

* * * * *